(12) United States Patent
Kamimura et al.

(10) Patent No.: US 12,116,666 B2
(45) Date of Patent: Oct. 15, 2024

(54) SUBSTRATE PROCESSING APPARATUS AND METHOD OF MANUFACTURING SEMICONDUCTOR DEVICE

(71) Applicant: HITACHI KOKUSAI ELECTRIC INC., Tokyo (JP)

(72) Inventors: Daigi Kamimura, Toyama (JP); Takeshi Ito, Toyama (JP); Tomoshi Taniyama, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 367 days.

(21) Appl. No.: 15/880,245

(22) Filed: Jan. 25, 2018

(65) Prior Publication Data

US 2018/0148834 A1 May 31, 2018

Related U.S. Application Data

(63) Continuation of application No. PCT/JP2016/069123, filed on Jun. 28, 2016.

(30) Foreign Application Priority Data

Aug. 4, 2015 (JP) ................................. 2015-154392

(51) Int. Cl.
*C23C 16/44* (2006.01)
*C23C 16/34* (2006.01)
(Continued)

(52) U.S. Cl.
CPC ........ *C23C 16/4408* (2013.01); *C23C 16/345* (2013.01); *C23C 16/45546* (2013.01);
(Continued)

(58) Field of Classification Search
CPC ........... H01L 21/67303; H01L 21/6732; C23C 16/4408; C23C 16/4412

See application file for complete search history.

(56) References Cited

U.S. PATENT DOCUMENTS 5,154,773 A * 10/1992 Furusawa ........... C23C 16/4412
118/724
5,390,703 A * 2/1995 Tengesdal ................. F16K 1/54
137/629
(Continued)

FOREIGN PATENT DOCUMENTS

JP 06-302679 A 10/1994
JP 2001-070781 A 3/2001
(Continued)

OTHER PUBLICATIONS

Singaporean Office Action issued on Nov. 16, 2018 for the Singaporean Patent Application No. 11201800143R.

*Primary Examiner* — Parviz Hassanzadeh
*Assistant Examiner* — Nathan K Ford
(74) *Attorney, Agent, or Firm* — Volpe Koenig

(57) ABSTRACT

Described herein is a technique capable of shortening the time required to reduce the oxygen concentration in a transfer chamber. According to the technique described herein, there is provided a substrate processing apparatus including: a transfer chamber wherein a substrate from a container is transported; a transfer robot configured to transfer the substrate through the transfer chamber; a purge gas supply mechanism configured to supply a purge gas into the transfer chamber; and a pressure control mechanism configured to control an inner pressure of the transfer chamber wherein the pressure control mechanism is provided at an exhaust channel wherethrough an inner atmosphere of the transfer chamber is exhausted, the pressure control mechanism including: an exhaust damper configured to fully open or fully close the exhaust channel; and an adjusting damper provided in the exhaust damper and configured to maintain the inner pressure of the transfer chamber at predetermined pressure.

16 Claims, 9 Drawing Sheets

(51) Int. Cl.
*C23C 16/455* (2006.01)
*C23C 16/458* (2006.01)
*C23C 16/54* (2006.01)
*H01L 21/67* (2006.01)
*H01L 21/673* (2006.01)
*H01L 21/677* (2006.01)
*H01L 21/02* (2006.01)

(52) U.S. Cl.
CPC .. *C23C 16/45578* (2013.01); *C23C 16/45589* (2013.01); *C23C 16/45591* (2013.01); *C23C 16/4584* (2013.01); *C23C 16/54* (2013.01); *H01L 21/67017* (2013.01); *H01L 21/67196* (2013.01); *H01L 21/67313* (2013.01); *H01L 21/67766* (2013.01); *H01L 21/67775* (2013.01); *H01L 21/0217* (2013.01); *H01L 21/02211* (2013.01); *H01L 21/0228* (2013.01); *H01L 21/67772* (2013.01)

(56) References Cited

U.S. PATENT DOCUMENTS

| | | | | |
|---|---|---|---|---|
| 5,876,280 | A | * | 3/1999 | Kitano .................. G03F 7/7075 454/187 |
| 5,944,602 | A | * | 8/1999 | Grundy .................. F24F 3/161 16/266 |
| 2007/0144607 | A1 | | 7/2007 | Lo |
| 2008/0105204 | A1 | | 5/2008 | Nakada et al. |
| 2008/0236488 | A1 | | 10/2008 | Takeshita et al. |
| 2009/0044749 | A1 | * | 2/2009 | Ozaki ............... H01L 21/67017 118/698 |
| 2009/0169342 | A1 | | 7/2009 | Yoshimura et al. |
| 2011/0305543 | A1 | | 12/2011 | Nakashima et al. |
| 2012/0170999 | A1 | | 7/2012 | Sakaue |
| 2013/0037146 | A1 | | 2/2013 | Anagnos |
| 2014/0150878 | A1 | | 6/2014 | Merry et al. |
| 2015/0380288 | A1 | | 12/2015 | Hirano |
| 2016/0372347 | A1 | * | 12/2016 | Kim ......................... F16K 1/44 |

FOREIGN PATENT DOCUMENTS

| | | |
|---|---|---|
| JP | 2002-175999 A | 6/2002 |
| JP | 2003-272846 A | 9/2003 |
| JP | 2010-129808 A | 6/2010 |
| JP | 2011-049507 A | 3/2011 |
| JP | 2012-253198 A | 12/2012 |
| JP | 2014-526025 A | 10/2014 |
| WO | 2014/141563 A1 | 9/2014 |

\* cited by examiner

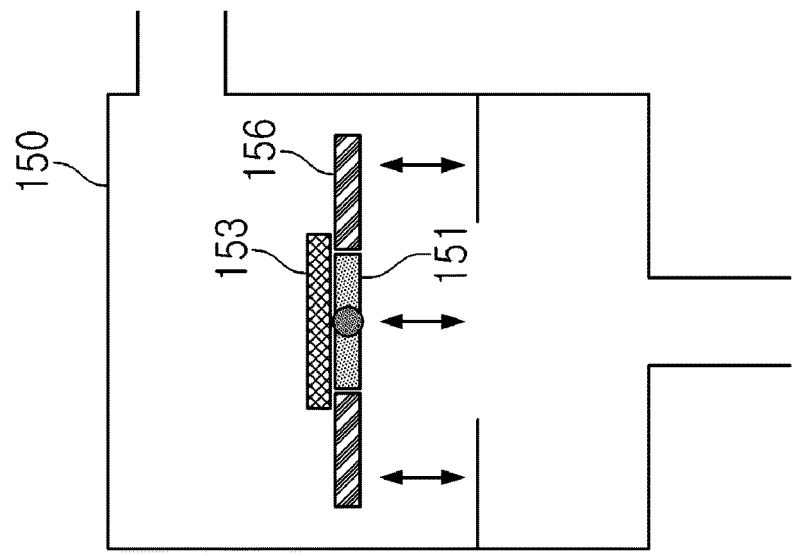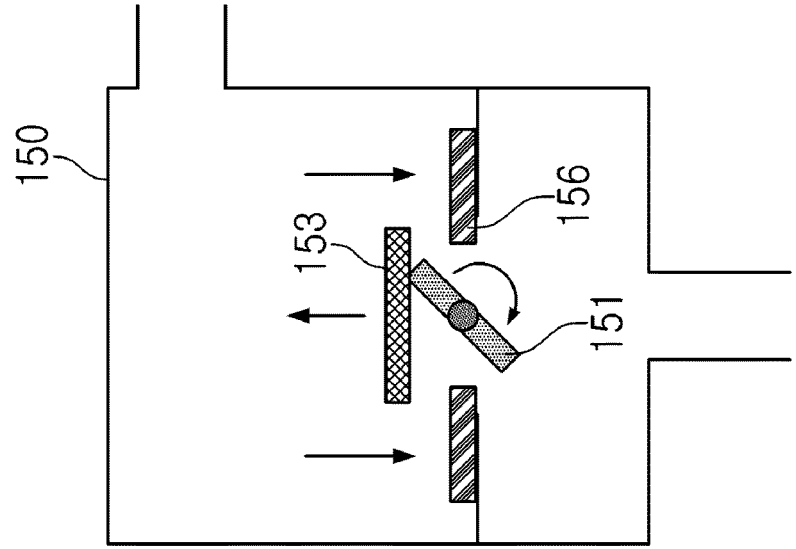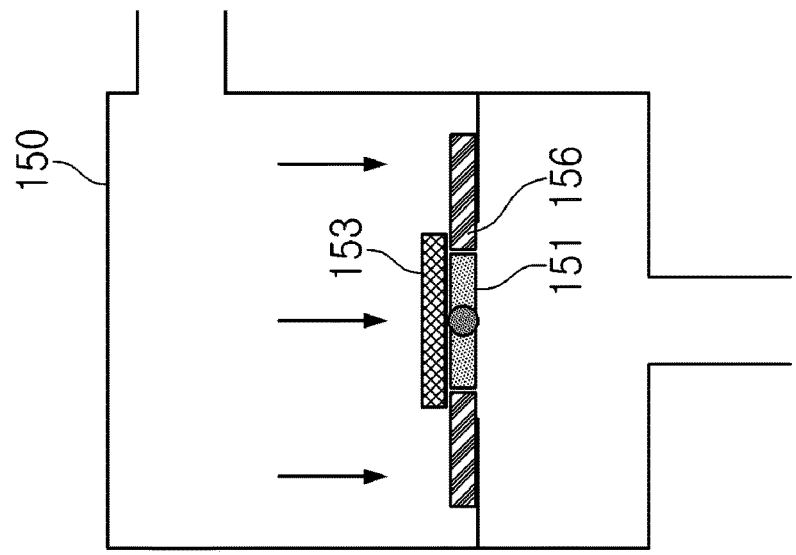

SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2016/069123, filed on Jun. 28, 2016, in the WIPO, and Japanese Patent Application No. 2015-154392, filed on Aug. 4, 2015, in the Japanese Patent Office, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Description of the Related Art

A thermal treatment of substrate is one of semiconductor device manufacturing processes. The thermal treatment of the substrate is performed, for example, using a vertical type substrate processing apparatus. The vertical type substrate processing apparatus includes a process chamber in which a wafer is processed and a transfer chamber disposed under the process chamber. In the transfer chamber, the wafer is charged into a boat which is a substrate support (substrate retainer) (wafer charging), or discharged from the boat (wafer discharging). In order to cool the wafer of high temperature unloaded from the process chamber to a predetermined temperature, a clean air flow is formed in the transfer chamber. The air flow is formed by a cleaning mechanism having a filter and a blower fan. The cleaning mechanism is installed at one side in the transfer chamber. The air flow is formed by injecting clean air through the cleaning mechanism into the transfer chamber.

However, according to the prior art, it takes long time to reduce the oxygen concentration in the transfer chamber, which is the substrate transport region.

SUMMARY

According to the technique described herein, the time required to reduce the oxygen concentration in the transfer chamber is shortened.

According to one aspect of the technique described herein, there is provided a substrate processing apparatus including: a transfer chamber 12 wherein a substrate from a container is transported; a transfer robot configured to transfer the substrate through the transfer chamber; a purge gas supply mechanism 162 configured to supply a purge gas into the transfer chamber; and a pressure control mechanism 150 configured to control an inner pressure of the transfer chamber wherein the pressure control mechanism is provided at an exhaust channel wherethrough an inner atmosphere of the transfer chamber is exhausted, the pressure control mechanism including: an exhaust damper configured to fully open or fully close the exhaust channel; and an adjusting damper provided in the exhaust damper and configured to maintain the inner pressure of the transfer chamber at predetermined pressure.

BRIEF DESCRIPTION OF THE DRAWINGS

FIG. 5A exemplifies a pressure control mechanism in fully closed state preferably used in the embodiment, FIG. 5B exemplifies the pressure control mechanism with an automatic damper and a press damper thereof open, and FIG. 5C exemplifies the pressure control mechanism in fully open state.

DETAILED DESCRIPTION

Embodiment

Figure 2:
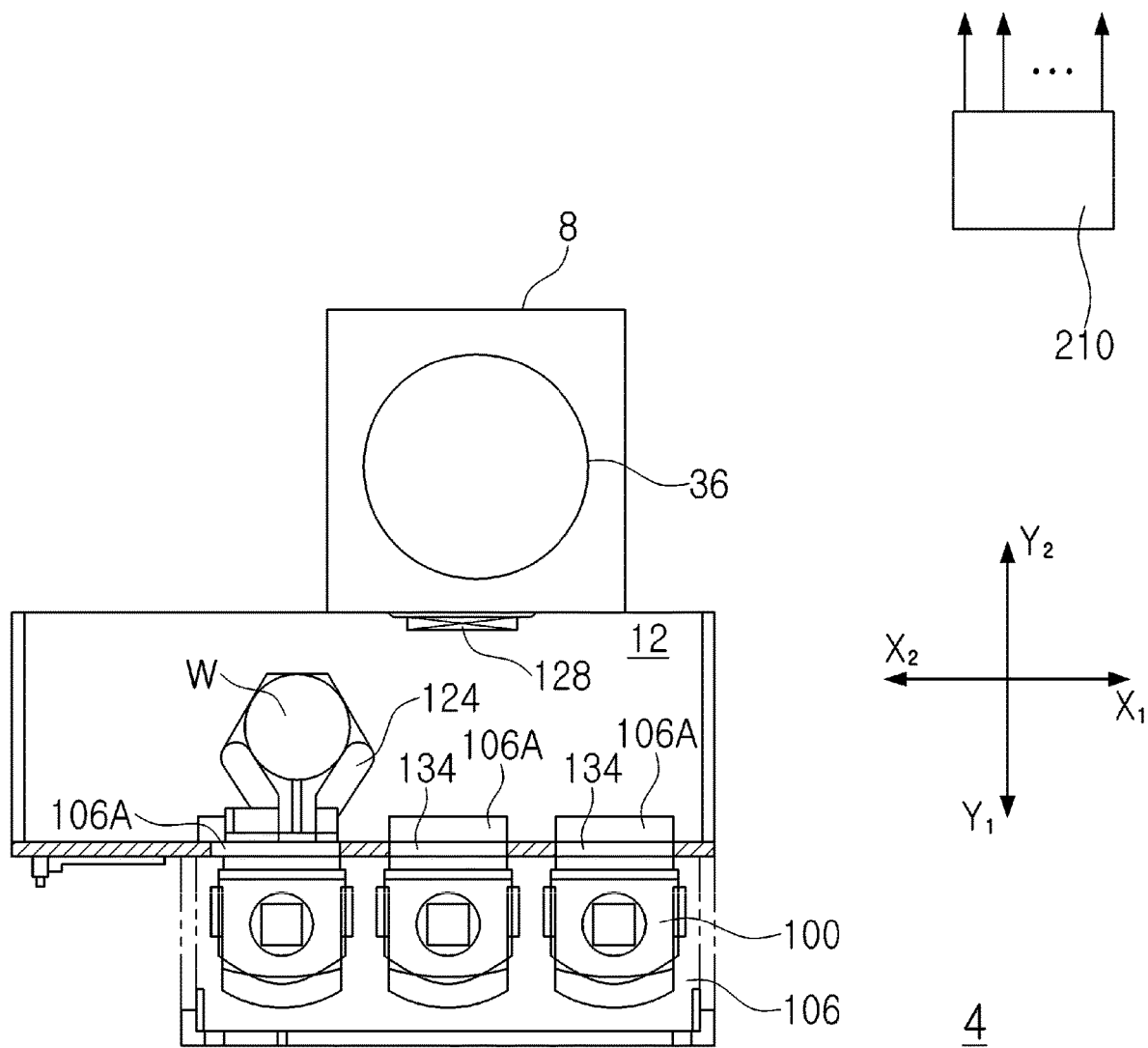
FIG. 2 schematically illustrates a horizontal cross-section of the substrate processing apparatus preferably used in the embodiment.
Figure 3:
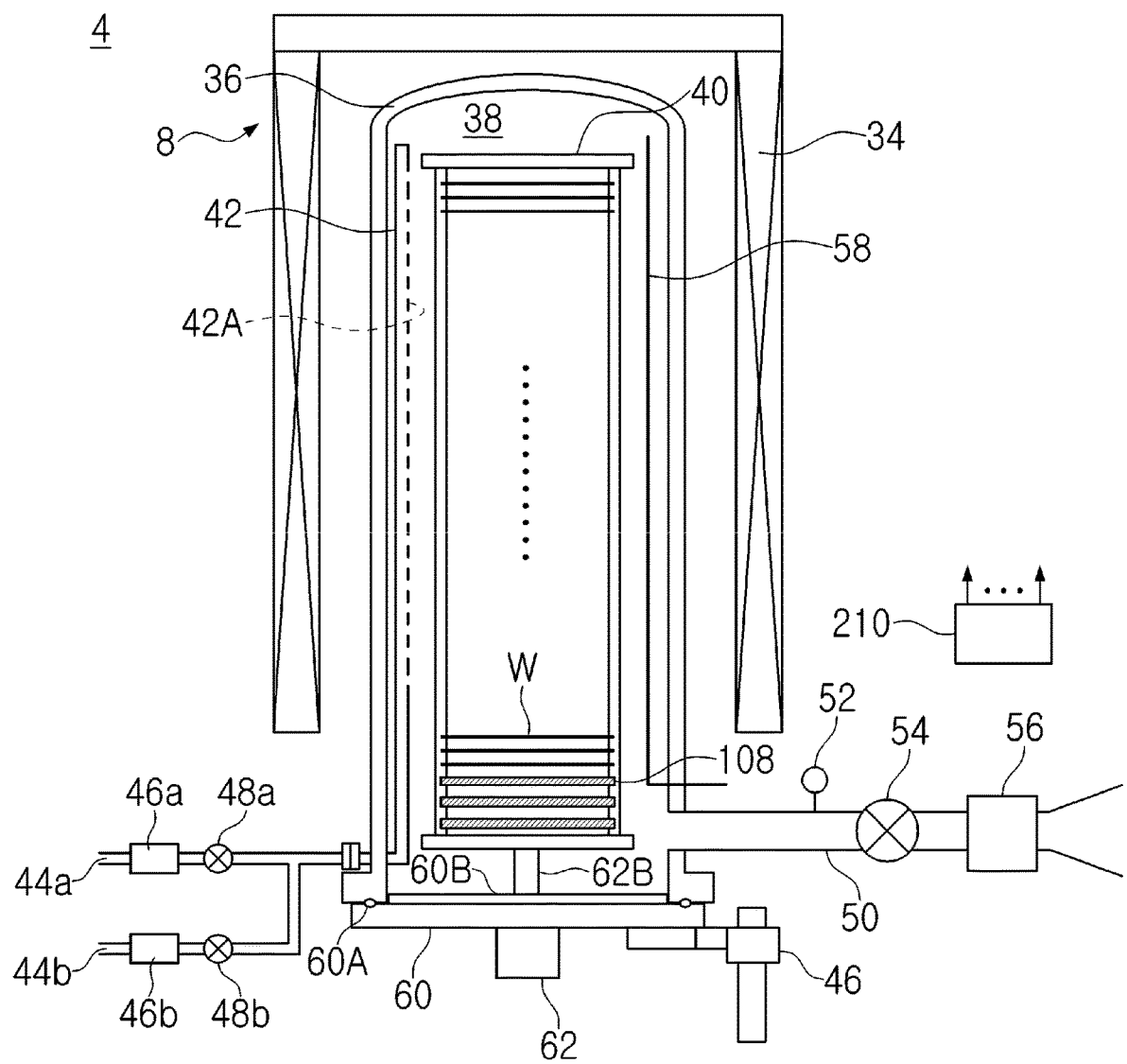
FIG. 3 schematically illustrates a vertical cross-section of a vertical type processing furnace of the substrate processing apparatus preferably used in the embodiment.

Hereinafter, an embodiment will be described with reference to FIGS. 1 through 3.

(1) Configuration of Substrate Processing Apparatus

Figure 1:
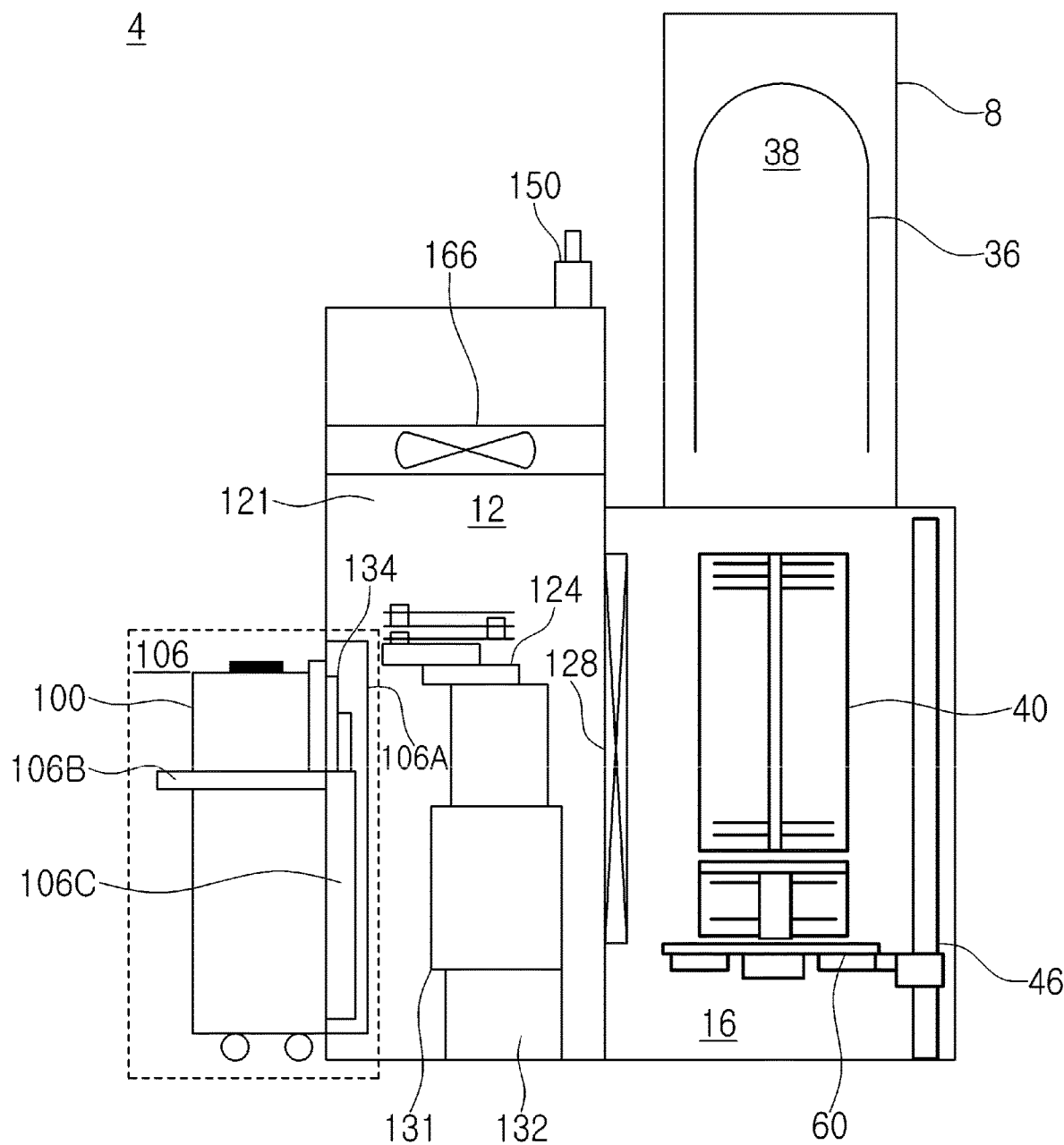
FIG. 1 schematically illustrates a vertical cross-section of a substrate processing apparatus preferably used in an embodiment described herein.

As shown in FIG. 1, a substrate processing apparatus 4 according to the embodiment is a vertical type heat treatment apparatus (batch type heat treatment apparatus) in which a heat treatment process according to a manufacturing method of an integrated circuit (IC) is performed. In the vertical type heat treatment apparatus according to the embodiment, a FOUP (Front Opening Unified Pod) 100 is used as a carrier (container) for accommodating the wafer W as s substrate. Hereinafter, the FOUP is simply referred to as a pod. The pod 100 is also used as a transport container for transporting the wafer W between substrate processing apparatuses. In the following description, front, rear, left and right directions are based on FIG. 2. Hereinafter, front, rear, left and right directions are indicated by arrow $Y_1$, arrow $Y_2$, arrow $X_2$ and arrow $X_1$ shown in FIG. 2, respectively. The substrate processing apparatus 4 includes a processing furnace 8, a first transfer chamber 12 and a second transfer chamber 16 which are described later.

First Transfer Chamber

The first transfer chamber 12 is provided in the front portion of a housing of the substrate processing apparatus 4.

The first transfer chamber 12 is space wherein the wafer W is transported. Hereinafter, the first transfer chamber 12 is simply referred to as "transfer chamber 12." A loading port mechanism 106 as a pod opening/closing mechanism for opening and closing a cover of the pod 100, loading the wafer W into the transfer chamber 12 and unloading the wafer W from the transfer chamber 12 is provided on the front side of a housing of the transfer chamber 12. The detailed configuration of the loading port mechanism 106 will be described later.

A gate valve 128 is provided on the rear side of the housing of the transfer chamber 12. The transfer chamber 12 is connected to a second transfer chamber 16, which will be described later, through the gate valve 128. A transport robot 124, which is a substrate transfer robot configured to transport a wafer W, is provided in the transfer chamber 12. The transport robot 124 is moved up and down by a transfer mechanism elevator 131, which is a drive mechanism provided in the transfer chamber 12, and moved forward, backward, left and right by a linear actuator 132. The inside of the transfer chamber 12 may be purged by circulating a purge gas.

Second Transfer Chamber

A second transfer chamber 16, which is a space wherein a boat 40 is moved up and down, is provided at the rear side of a housing 12. The second transfer chamber 16 may be simply referred to as "standby chamber 16" hereinafter. The communication port (not shown) is spatially connected to a reaction tube 36, which will be described later, and is provided at the ceiling of the standby chamber 16. A boat elevator 46 is an elevating mechanism for vertically moving the seal cap 60 which will be described later, and is provided at one side in the standby chamber 16. When the seal cap 60 is moved upward/downward by the boat elevator 46, the boat 40 described later may be loaded into the reaction tube 36 or unloaded out of the reaction tube 36. The standby chamber 16 is configured such that a purge gas may be circulated therein. An oxygen concentration detector (not shown) configured to detect an oxygen concentration in the standby chamber 16 is provided in the standby chamber 16. Based on the oxygen concentration detected by the oxygen concentration detector, the oxygen concentration in the standby chamber 16 may be controlled.

Processing Furnace

The processing furnace 8 is provided above the standby chamber 16. As shown in FIG. 3, the processing furnace 8 includes a heater 34 serving as a heating apparatus (heating mechanism). The heater 34 is cylindrical, and vertically provided while being supported by a heater base (not shown) as a support plate. The heater 34 also functions as an activation mechanism (excitation unit) for activating (exciting) a gas into heat, which will be described later.

A reaction tube 36, which is also referred to as "reaction vessel" or "processing vessel, is provided in and concentric with the heater 36. The reaction tube 36 is made of a heat-resistant material such as quartz and silicon carbide (SiC), and cylindrical with a closed upper end and an open lower end. A process chamber 38 is provided in the hollow cylindrical portion of the reaction tube 36. The process chamber 381 may accommodate a boat 40 charged with the wafers 200.

A nozzle 42 is provided in the process chamber 38 through the lower portion of the reaction tube 36. The nozzle 42 is made of a heat-resistant material such as quartz and silicon carbide (SiC). A gas supply pipe 44a connected to the nozzle 42. A mass flow controller (MFC) 46a serving as a flow rate controller (flow rate control unit) and a valve 48a serving as a opening/closing valve are sequentially installed at the gas supply pipe 44a from the upstream side toward the downstream side of the gas supply pipe 44a. A gas supply pipe 44b for supplying an inert gas is connected to the downstream side of the valve 48a installed at the gas supply pipe 44a. A mass flow controller (MFC) 46b a valve 48b are sequentially installed at the gas supply pipe 44b from the upstream side toward the downstream side of the gas supply pipe 44b. A process gas supply system (process gas supply unit) mainly includes the gas supply pipe 44a, the MFC 46a and the valve 48a.

The nozzle 42 is provided in an annular space between the inner wall of the reaction tube 36 and the wafer W, and extended from bottom to top of the inner wall of the reaction tube 36 along the stacking direction of the wafer 200. A plurality of gas supply holes 42A for supplying gases may be provided at side surfaces of the nozzle 42. The gas supply holes 42A are open toward the center of the reaction tube 36, and configured to supply gases toward the wafer W.

An exhaust pipe 50 for exhausting the inner atmosphere of the process chamber 38 is provided at the reaction tube 36 A vacuum pump 56 serving as a vacuum exhauster is connected to the exhaust pipe 50 through a pressure sensor 52 and an APC (Automatic Pressure Controller) valve 54. The pressure sensor 52 serves as a pressure detector (pressure detection unit) to detect the inner pressure of the process chamber 38, and the APC valve 54 serves as a pressure controller (pressure adjusting unit). With the vacuum pump 56 in operation, the APC valve 54 may be opened/closed to vacuum-exhaust the process chamber 38 or stop the vacuum exhaust. With the vacuum pump 56 in operation, the opening degree of the APC valve 54 may be adjusted based on the pressure detected by the pressure sensor 52, in order to control the inner pressure of the process chamber 38. An exhaust system mainly includes the exhaust pipe 50, the APC valve 54 and the pressure sensor 52. The exhaust system may further include the vacuum pump 56.

A temperature detector (temperature detecting unit) 58 is provided in the reaction tube 36. The energization state of the heater 34 is controlled based on the temperature detected by the temperature detector 58 such that the inner temperature of the process chamber 38 has a desired temperature distribution. The temperature detector 58 is provided along the inner wall of the reaction tube 36.

The seal cap 60 serving as a furnace opening cover may airtightly seal the lower end opening of the reaction tube 36, is provided under the reaction tube 36. An O-ring 60A serving as a sealing member is provided on the upper surface of the seal cap 60 so as to be in contact with the lower end of the reaction tube 36. A seal cap plate 60B for protecting the seal cap 60 is provided on a portion of an upper surface of the seal cap 60 inner than the O-ring 60A. The seal cap 60 is provided under the reaction tube 36 so as to be in contact with the lower end of the reaction tube 36.

The boat 40 serving as a substrate retainer aligns the wafer W, for example, 25 to 200 wafers in the vertical direction and supports the wafers, while the wafers are horizontally positioned and concentric with one another. That is, the boat 40 is configured to support the wafers at predetermined intervals therebetween.

A rotating mechanism 62 configured to rotate the boat 40 is provided at the seal cap 60 opposite to the process chamber 38. A rotating shaft 62B of the rotating mechanism 62 is connected to the boat 40 through the seal cap 60. As the rotating mechanism 62 rotates the boat 40, the wafer W is rotated.

Figure 6:
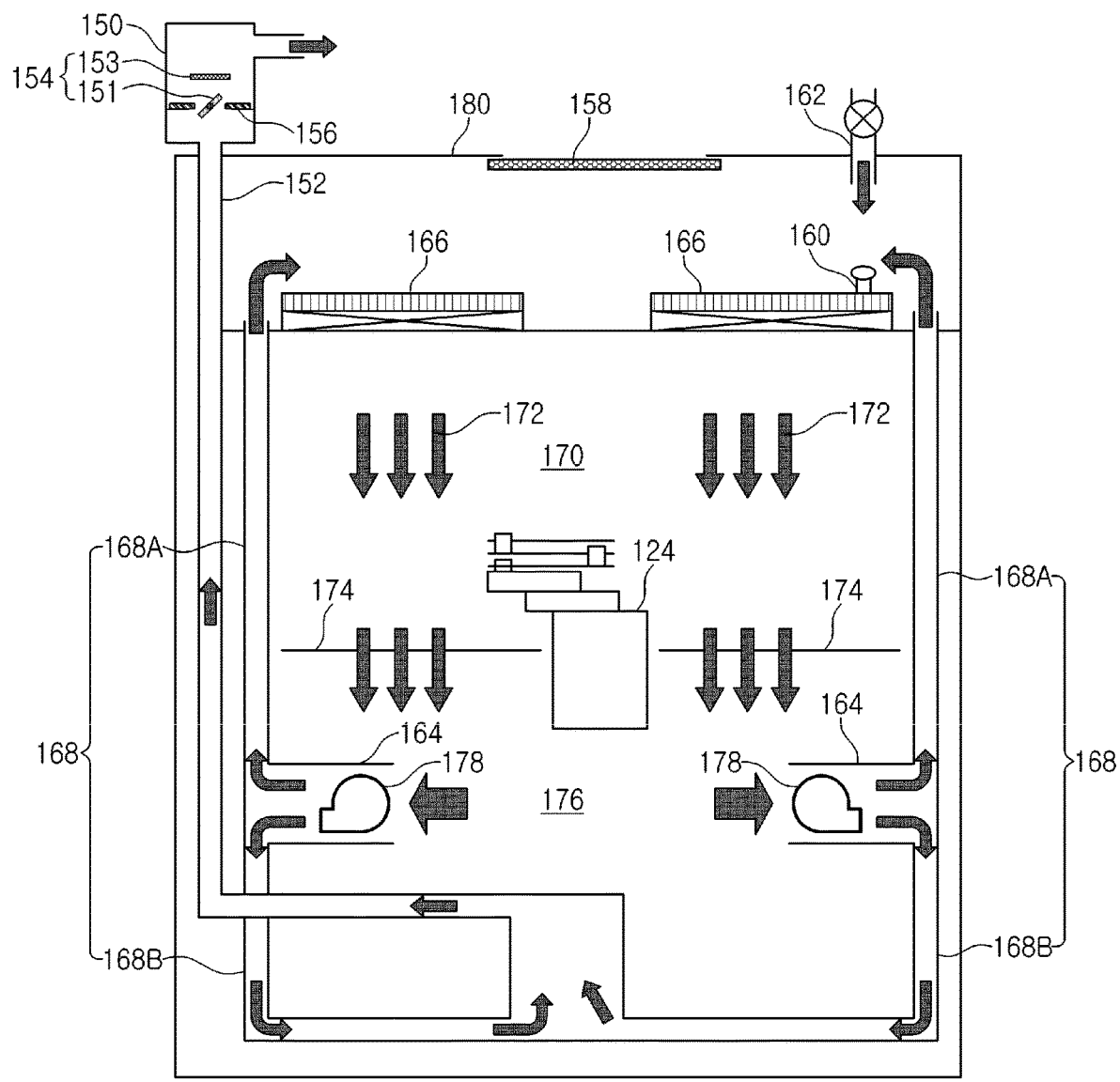
FIG. 6 schematically illustrates a transfer chamber of the substrate processing apparatus preferably used in the embodiment.

Hereinafter, the configuration of the transfer chamber 12 according to the embodiment will be described in detail with reference to FIGS. 1, 2, and 6. As shown in FIG. 6, a purge gas supply mechanism 162 for supplying purge gas to a duct (not shown) around the transfer chamber 12 and a pressure control mechanism 150 for controlling the inner pressure of the transfer chamber 12 are provided in the transfer chamber 12. The purge gas supply mechanism 162 is configured to supply purge gas into the duct according to the oxygen concentration in the transfer chamber 12 detected by an oxygen concentration detector 160. The oxygen concentration detector 160 is installed at the upstream side of a cleaning mechanism 166, which is a gas supply mechanism for supplying into the transfer chamber 12 a purge gas with dust or impurity thereof removed. The oxygen concentration in the transfer chamber 12 may be controlled by the purge gas supply mechanism 162 and the pressure control mechanism 150. According to the embodiment, the oxygen concentration detector 160 may be configured to detect the moisture concentration as well as the oxygen concentration.

As shown in FIG. 6, the cleaning mechanism (fan/filter unit) 166 equipped with ULPA filters is disposed at each of the left side and the right side of the ceiling of the transfer chamber 12. A porous plate 174, which is a rectifying plate for adjusting the flow of the purge gas, is provided directly below the horizontal transport arm (not shown) of the transport robot 124. The porous plate (e.g. punched panel) 174 has a plurality of holes. The space in the transfer chamber 12 is divided into a first space 170, which is the upper space, and a second space 176, which is the lower space by the porous plate 174. The space between the ceiling and the porous plate 174 is the first space 170 which is the wafer transport region and the space between the porous plate 174 and the bottom surface of the transfer chamber 12 is the second space 176 which is the gas exhaust region.

A ventilation mechanism 164 for circulating and exhausting the purge gas flown through the transfer chamber 12 is provided in each of the left side and the right side in the lower part of the second space 176 under the transfer chamber 12 with the substrate transport robot 124 therebetween. A circulation path from the cleaning mechanism 166 to the ventilation mechanism 164 and a channel 168 serving as the exhaust path are provided in each of the left side and the right side with the substrate transport robot 124 therebetween. A cooling mechanism (not shown) configured to control the temperature of the purge gas flowing therethrough may be provided in the channel 168.

The channel 168 includes two sub-channels, namely a circulation channel 168A and a sub-exhaust channel 168B. The left sub-exhaust channel 168B and the right sub-exhaust channel 168B are merged to a single exhaust channel 152 at the downstream side of the sub-exhaust channels 168B.

All of the inner pressure of the pod 100, the inner pressure of the transfer chamber 12 and the inner pressure of the standby chamber 16 are controlled to be higher than the atmospheric pressure by 10 Pa to 200 Pa (gauge pressure). Preferably, the inner pressure of the transfer chamber 12 is higher than that of the standby chamber 16, and the inner pressure of the standby chamber 16 is higher than that of the pod 100.

Figure 7:
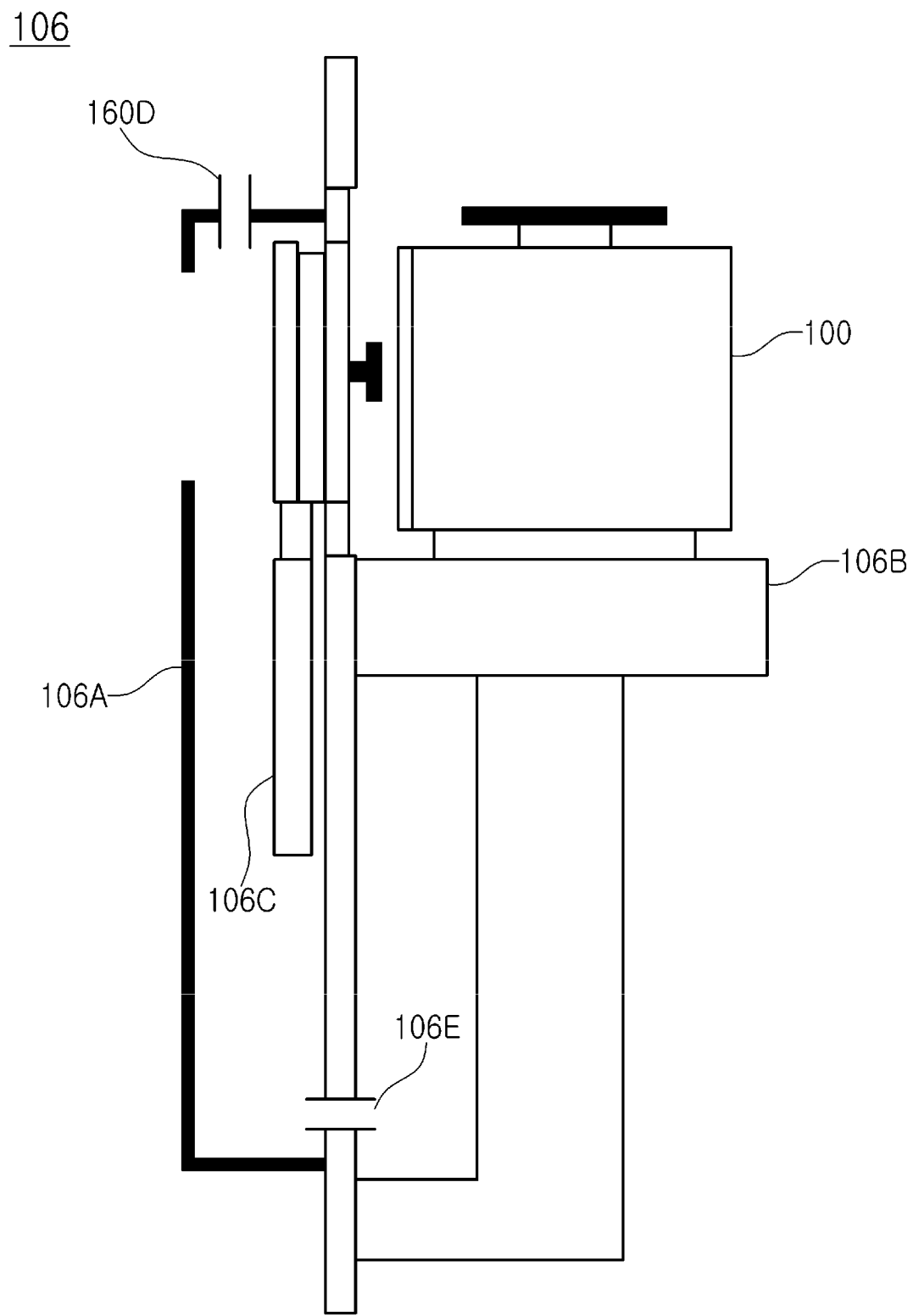
FIG. 7 schematically illustrates a vertical cross-section of a loading port mechanism of the substrate processing apparatus preferably used in the embodiment.

As shown in FIG. 7, the loading port mechanism 106 includes a housing 106A, a stage 106B and an opener 106C. The pod 100 may be placed on the stage 106B. The stage 106B is capable of transporting the pod 100 close to a substrate loading/unloading port 134 provided at the front side of the housing of the transfer chamber 12. The housing 106A has an opening facing the substrate loading/unloading port 134. The opener 106C is provided in a space in the housing 106A and is configured to open and close the cover of the pod 100 and the opening. The opener 106C is retracted into the space below the housing 106A while supporting the cover of the pod 100. A purge gas supply port 106D configured to supply purge gas is provided at the ceiling of the housing 106A to locally purge the inside of the housing 106A and the inside of the pod 100. The purge gas is exhausted from the housing 106A through an exhaust port 106E at the lower portion of the housing 106A after purging the inside the housing 106A and the inside of the pod 100.

Figure 8:
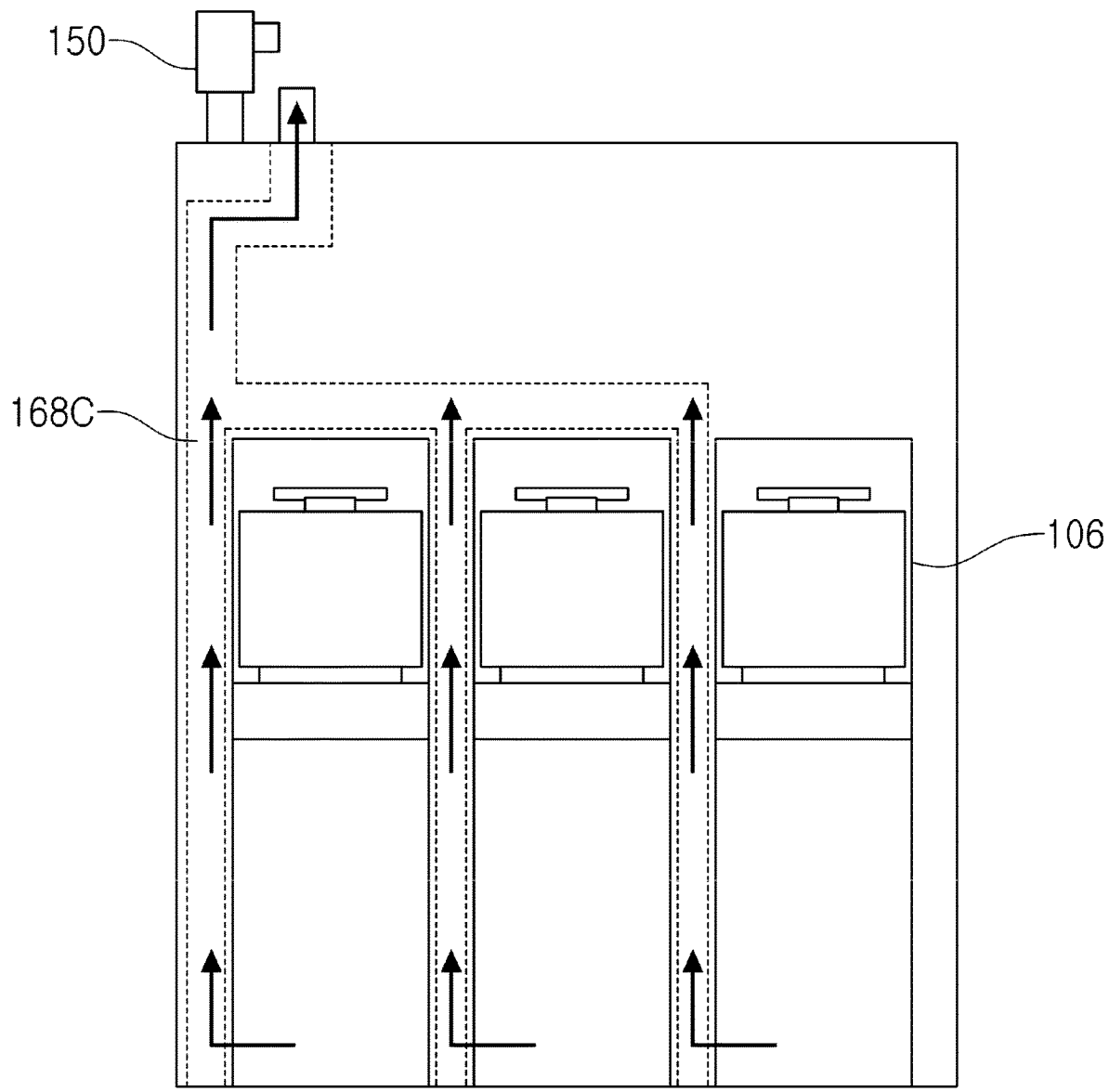
FIG. 8 schematically illustrates an exhaust path of the loading port mechanism of the substrate processing apparatus preferably used in the embodiment.

As shown in FIG. 8, the purge gas that has purged the inside the loading port mechanism 106 and the inside the pod 100 is not directly exhausted toward the transfer chamber 12. That is, the purge gas is exhausted via an exhaust path which is independent of the exhaust path provided in the transfer chamber 12. For example, the purge gas is exhausted via exhaust channels 168C. The exhaust channels 168C may be, for example, a hollow portion in each of the pipes (column) constituting the frame structure of the transfer chamber 12. That is, the exhaust port 106E provided at the lower portion of the housing 106A is connected to the hollow portion of the frame constituting the transfer chamber 12. The exhaust channels 168C of the loading port mechanisms 106 merge above the loading port mechanisms 106. The purge gas is exhausted directly to an exhaust duct through the merged exhaust channel 168C. Therefore, the inner atmosphere of the loading port mechanisms 106 may be prevented from flowing into the transfer chamber 12 such that the oxygen concentration in the transfer chamber 12 is suppressed from rising.

Figure 9:
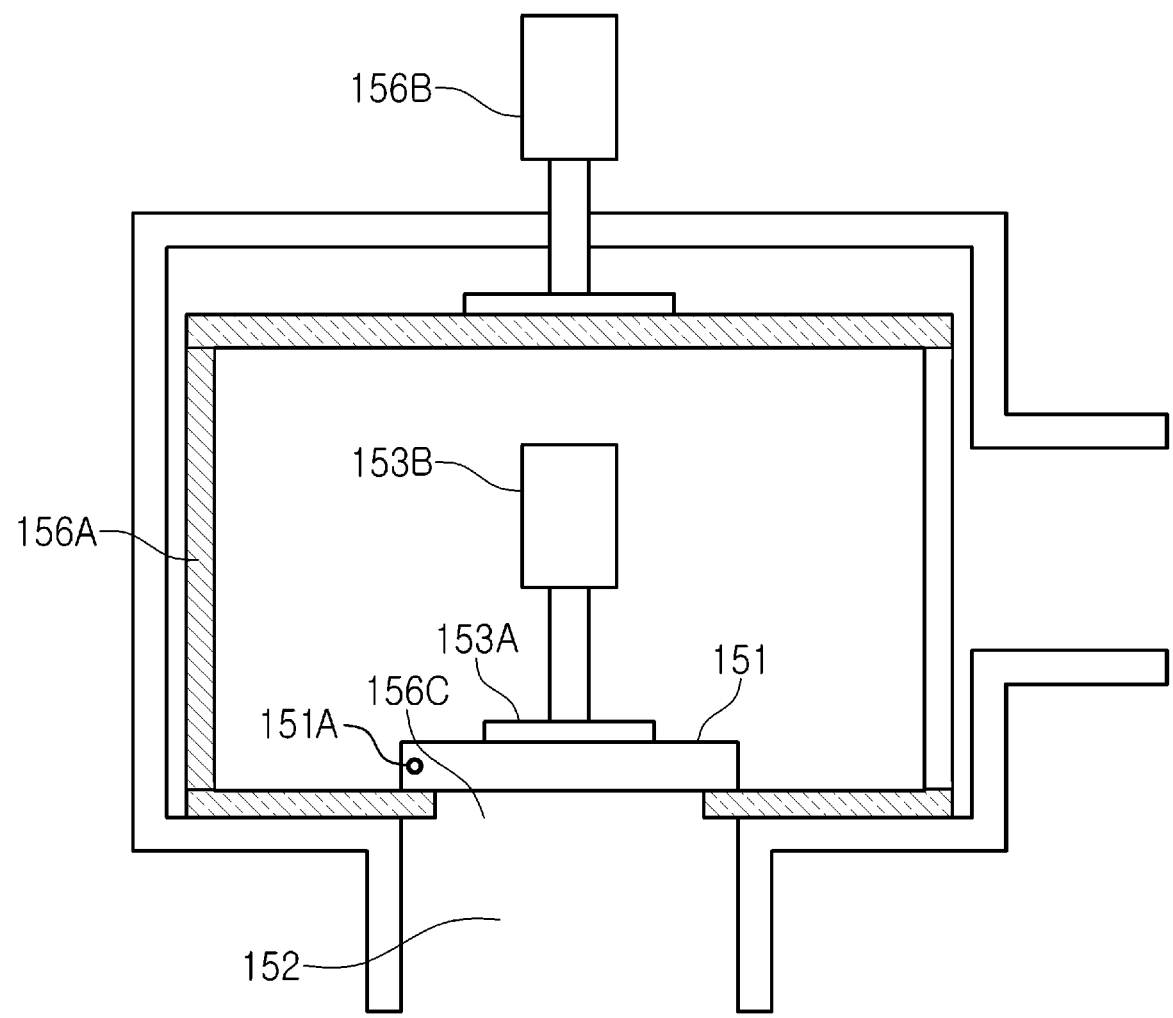
FIG. 9 schematically illustrates a vertical cross-section of the pressure control mechanism of the substrate processing apparatus preferably used in the embodiment.

Next, the pressure control mechanism 150 will be described. As shown in FIGS. 5 and 9, The pressure control mechanism 150 includes an adjusting damper 154 configured to maintain the inner pressure of the transfer chamber 12 at a predetermined pressure and an exhaust damper 156 configured to fully open or fully close the exhaust channel 152. The pressure control mechanism 150 is configured to adjust the inner pressure of the transfer chamber 12 to be a desired pressure by controlling the opening and closing of the adjusting damper 154 and the exhaust damper 156. The pressure control mechanism 150 is able to control the inner pressure of the transfer chamber 12 by the above-described configuration. The adjusting damper 154 includes an automatic damper (back pressure valve) 151 which is configured to open when the inner pressure of the transfer chamber 12 is higher than a predetermined pressure and a press damper 153 configured to control the opening and closing of the automatic damper 151.

The exhaust damper 156 includes a cover member 156A that closes the exhaust channel 152 and a first drive mechanism 156B which is a drive mechanism configured to operate the cover member 156A. The cover member 156A has a shape of a box with an open side wall and a partially closed lower portion. An opening 156C spatially connected to the exhaust channel 152 is provided at the lower portion of the cover member 156A. The adjusting damper 154 is provided in the cover member 156A so as to open and close the opening 156C.

The press damper 153 is in contact with the upper surface of the automatic damper 151 and includes a press mechanism 153A for pressing the automatic damper 151 and a second drive mechanism 153B which is a drive mechanism configured to operate the press mechanism 153A. The automatic damper 151 is forcibly closed by the press mechanism 153A pressing against the upper surface of the automatic damper 151. In the embodiment, "open the press damper 153" refers to a state in which the automatic damper 151 is not pressed by the press mechanism 153A, and "close the press damper 153" refers to a state in which the automatic damper 151 is pressed by the press mechanism 153A. The automatic damper 151 is for maintaining the inner pressure of the transfer chamber 12 at a predetermined pressure. The automatic damper 151 includes a hinge 151A and a balancer (not shown) fixed to the hinge. The automatic damper 151 opens and closes the exhaust channel 152 by opening and closing the opening 156C, respectively, as shown in FIG. 5. The automatic damper 151 is opened when the inner pressure of the transfer chamber (primary side) is greater than a predetermined pressure (i.e., the inner pressure of the transfer chamber >predetermined pressure). By adjusting the weight of the balancer, the predetermined pressure may be varied. For example, when the balancer is heavy, the predetermined pressure is relatively high, and when the balancer is light, the predetermined pressure is relatively low.

In the embodiment, the automatic damper 151 may be integrative with the cover member 156A. Referring to FIG. 9, the exhaust channel 152 is spatially connected to the pressure control mechanism 150 through the lower portion of the pressure control mechanism 150 and is configured to exhaust the gas through the side wall of the pressure control mechanism 150. A hinge 151A may be provided between the automatic damper 151 and one side of the opening 156C opposite to the sidewall of the pressure control mechanism 150 through which the gas is exhausted such that the automatic damper 151 may open and close the opening 156C toward the sidewall of the pressure control mechanism 150 through which the gas is exhausted, resulting in a smooth exhaust of gas without stagnation of air in the pressure control mechanism 150.

Next, the operation of the pressure control mechanism 150 will be described. As shown in FIGS. 5A, 5C and 9, the exhaust damper 156 is capable of driving the adjusting damper 154 simultaneously with the cover member 156A to fully open or fully close the exhaust channel 152. That is, the press mechanism 153A is capable of pressing the automatic damper 151 to drive the cover member 156A with the opening 156C closed such that to the exhaust channel 152 is fully opened or fully closed. By controlling the operations of the automatic damper 151, the press damper 153 and the exhaust damper 156, the inner pressure of the transfer chamber 12 may be controlled and the hydrogen concentration and the oxygen concentration in the transfer chamber 12 may be controlled.

Next, the flow of the purge gas in the transfer chamber 12 will be described. As shown in FIG. 6, the purge gas, which is an inert gas such as $N_2$ gas, having the flow rate thereof controlled is introduced into the transfer chamber 12 by the purge gas supply mechanism 162. A down flow 172 of $N_2$ gas is formed in the transfer chamber 12 through the cleaning mechanism 166 and the ceiling of the transfer chamber 12. A pressure difference between the first space 170 and the second space 176 may be generated by dividing the inner space of the transfer chamber 12 into the first space 170 and the second space 176 by the porous plate 174. That is, the inner pressure of the first space 170 may be higher than that of the second space 176. As a result, a diffusion of particles originating from drive mechanisms such as the transfer mechanism elevator 131 and the linear actuator 132 below the arm (not shown) into the wafer transport region may be suppressed. The rise of the particles from the bottom surface of the transfer chamber 12 to the wafer transport region may also be prevented.

The $N_2$ gas exhausted from the transfer chamber 12 by the ventilation mechanism 164 is supplied to two channels, namely the channel 168 and the exhaust channel 152 at the downstream side of the ventilation mechanism 164. The channel 168 is connected to the upstream side of the cleaning mechanism 166 and is configured to supply the purge gas back into the transfer chamber 12. The exhaust channel 152 is connected to the pressure control mechanism 150 and is a flow path for exhausting $N_2$ gas. When the conductance of the channel 168 is small, a fan 178, which may be a blower fan for promoting the circulation of $N_2$ gas, may be provided in each of the left and right ventilation mechanisms 164. The fan 178 facilitates smooth flow of $N_2$ gas and the formation of the circulation air flow. The pressure control mechanism 150 is provided at the downstream of the exhaust channel 152. By performing circulation and exhaust with divided systems in the left and the right, air flow may be uniformly formed in the transfer chamber 12.

Next, the operation of the pressure control mechanism 150 will be described in detail. The adjusting damper 154 and the exhaust damper 156 are closed and the $N_2$ gas is supplied by the purge gas supply mechanism 162 to replace the inner atmosphere of the transfer chamber 12 with $N_2$ gas. This reduces the oxygen concentration in the transfer chamber 12. That is, so as to reduce the oxygen concentration, the automatic damper 151, the press damper 153 and the exhaust damper 156 are closed. The oxygen concentration in the transfer chamber 12 may be forcibly reduced by controlling the automatic damper 151, the press damper 153, the exhaust damper 156 and the purge gas supply mechanism 162. When the oxygen concentration in the transfer chamber 12 lowered to a predetermined level, the adjusting damper 154 is opened. That is, the automatic damper 151 and the press damper 153 are opened as shown in FIG. 5B. Accordingly, the oxygen concentration in the transfer chamber 12 may be maintained at the predetermined level while suppressing the inner pressure of the transfer chamber 12 from rising.

When $N_2$ gas is circulated in the transfer chamber 12, the adjusting damper 153 is in open state and the exhaust damper 156 is in closed state. That is, the automatic damper 151 and the press damper 153 are in open state and the exhaust damper 156 is in closed state. The inner pressure of the transfer chamber 12 is controlled such that the inner pressure of the transfer chamber 12 is higher than that of the loading port mechanism 106 and the inner pressure of the loading port mechanism 106 is higher than that of the pod 100. More preferably, the inner pressure of the transfer chamber 12 is controlled such that the inner pressure of the transfer chamber 12 is higher than that of the loading port mechanism 106. That is, the inner pressure of the transfer chamber 12 is controlled to be higher than those of the pod 100 and the loading port mechanism 106 such that the inner atmospheres of the pod 100 and the loading port mechanism 106 are suppressed from diffusing into the transfer chamber 12. Accordingly, the amount of oxygen or moisture diffused into the transfer chamber 12 from the pod 100 and the loading port mechanism 106 is reduced.

When the $N_2$ atmosphere of the transfer chamber 12 is replaced, an intake damper 158 provided at the upper portion of the housing 180 of the transfer chamber 12 is opened and the atmosphere flows from the exterior of the housing into the transfer chamber 12. At this time, the adjusting damper 154, i.e. the automatic damper 151 and the press damper 153 are in closed state and the exhaust damper 156 is in open state. That is, the exhaust channel 152 is fully opened.

The gate valve 128 is controlled to open or close only when the inner pressure of the transfer chamber 12 and the inner pressure of the standby chamber 16 satisfy a predetermined condition. The predetermined condition may be that the inner pressure of the transfer chamber 12 is higher than that of the standby chamber 16. For example, the inner pressure of the transfer chamber 12 is preferably 50 Pa to 300 Pa, and the inner pressure of the standby chamber 16 is preferably 40 Pa to 300 Pa. It is preferable that the inner pressure of the transfer chamber 12 is higher than that of the standby chamber 16 by about 20 Pa. That is, it is preferable that the inner pressure of the transfer chamber 12 is preferably 1 to 7.5 times the inner pressure of the standby chamber 16. When the inner pressure of the transfer chamber 12 is lower than that of the standby chamber 16, the inner atmosphere of the standby chamber 16 may flow into the transfer chamber 12. As a result, contaminants may flow into the transfer chamber 12 from the standby chamber 16. When the inner pressure of the transfer chamber 12 is excessively higher than that of the standby chamber 16, that is, when the inner pressure of the transfer chamber 12 is more than 7.5 times the inner pressure of the standby chamber 16, the particles in the chamber 16 may flow into the standby chamber 16. Therefore, when the inner pressure of the transfer chamber 12 ranges from 50 Pa to 300 Pa (gauge pressure) and the inner pressure of the standby chamber 16 ranges from 40 Pa to 300 Pa (gauge pressure), that is, when the inner pressure of the transfer chamber 12 is preferably 1 to 7.5 times the inner pressure of the standby chamber 16, the contaminant may be prevented from flowing into the transfer chamber 12 from the standby chamber 16, and the particles may be prevented from flowing into the standby chamber 16 from the drive mechanism such as the transport robot 124 in the transfer chamber 12. When the press damper 153 is in close state, the gate valve 128 is controlled to be in closed state. When the press damper 153 is in closed state, the exhaust channel 152 is in fully closed state or in fully open state to replace the inner atmosphere of the transfer chamber 12. Therefore, it is preferable that the gate valve 128 is not opened.

The gate valve 128 may be controlled according to the oxygen concentration rather than the pressure. For example, when the oxygen concentration in the standby chamber 16 is lower than a threshold value, the gate valve 128 may be opened. For example, the threshold value of the oxygen concentration in the standby chamber 16 may be the oxygen concentration in the transfer chamber 12. That is, when the oxygen concentration in the standby chamber 16 is lower than the oxygen concentration in the transfer chamber 12, the gate valve 128 may be opened.

The automatic damper 151 may be opened or closed by the second drive mechanism 153B of the press damper 153 by adjusting the pressing of the press mechanism 153A. Thus, the opening degree of the exhaust channel 152 may be adjusted and the pressure in the transfer chamber 12 may be controlled. That is, the inner pressure of the transfer chamber 12 may be controlled as desired by adjusting the amount of the pressing of the drive mechanism 153B.

Figure 4:
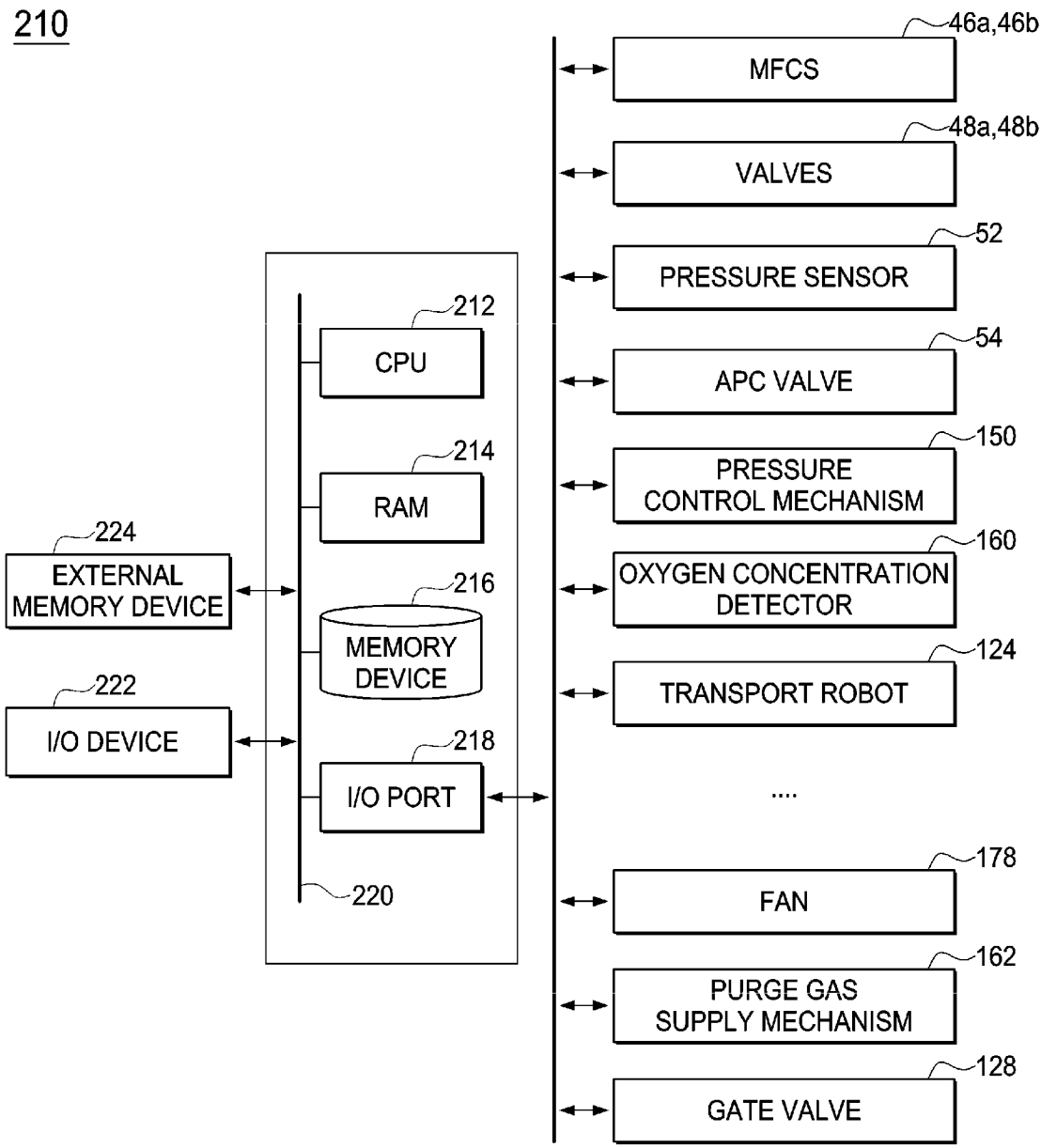
FIG. 4 is a block diagram schematically illustrating a controller and components controlled by the controller of the substrate processing apparatus preferably used in the embodiment.

As shown in FIG. 4, the controller 210 serving as a control unit (control means) is embodied by a computer including a CPU (Central Processing Unit) 212, a RAM (Random Access Memory) 214, a memory device 216 and an I/O port 218. The RAM 214, the memory device 216 and the I/O port 218 may exchange data with the CPU 212 through an internal bus 220. For example, an I/O device 222 such as a touch panel is connected to the controller 210.

The memory device 216 is embodied by components such as a flash memory and HDD (Hard Disk Drive). A control program for controlling the operation of the substrate processing apparatus or a process recipe containing information on the sequence and conditions of a substrate processing described later is readably stored in the memory device 216. The process recipe is obtained by combining steps of the substrate processing described later such that the controller 210 may execute the steps to acquire a predetermine result, and functions as a program. Hereafter, the process recipe and the control program are collectively referred to as a program. In this specification, "program" may indicate only the process recipe, indicate only the control program, or indicate both of them. The RAM 214 is a work area where a program or data read by the CPU 212 is temporarily stored.

The I/O port 218 is connected to the above-described components such as the MFCs 46$a$ and 46$b$, the valves 48$a$ and 48$b$, the pressure sensor 52, the APC valve 54, the pressure control mechanism 150, the oxygen concentration detector 160, the transport robot 124, the fan 178, the purge gas supply mechanism 162 and the gate valve 128.

The CPU 212 is configured to read a control program from the memory device 216 and execute the read control program. Furthermore, the CPU 212 is configured to read a process recipe from the memory device 216 according to an operation command inputted from the I/O device 222. According to the contents of the read process recipe, the CPU 212 may be configured to control various operations such as flow rate adjusting operations for various gases by the MFCs 46$a$ and 46$b$, opening/closing operations of the valves 48$a$ and 48$b$, an opening/closing operation of the APC valve 54, a pressure adjusting operation by the APC valve 54 based on the pressure sensor 52, a start and stop of the vacuum pump 56, a temperature adjusting operation of the heater 34 based on the temperature detector 58, a rotation operation and rotation speed adjusting operation of the boat 40 by the rotating mechanism 62, and an elevating operation of the boat 40 by the boat elevator 46, an transport operation of the substrate by the substrate transport robot 124, a control operation of the inner pressure of transfer chamber 12 by the pressure control mechanism 150 based on concentration detected by the oxygen concentration detector 160, control operation of the inner pressure of transfer chamber 12 by the purge gas supply mechanism 162 and opening/closing operations of the gate valve 128.

The controller 210 may be embodied by installing the above-described program stored in an external memory device 224 into a computer, the external memory device 224 including a magnetic disk such as a magnetic tape, a flexible disk and a hard disk, an optical disk such as CD and DVD, a magneto-optical disk such as MO, and a semiconductor memory such as a USB memory and a memory card. The memory device 216 or the external memory device 224 may be embodied by a non-transitory computer readable recording medium. Hereafter, the memory device 216 and the external memory device 224 are collectively referred to as recording media. In this specification, "recording media" may indicate only the memory device 216, indicate only the external memory device 224, and indicate both of the memory device 216 and the external memory device 224. In addition to the external memory device 224, a communication unit such as the Internet and dedicated line may be used as the unit for providing a program to a computer.

Hereinafter, an exemplary sequence of forming a film on a substrate (hereinafter, also referred to as film-forming process), which is a substrate processing for manufacturing a semiconductor device, using the substrate processing apparatus 4 will be described. A silicon nitride (Si₃N₄) film (hereinafter, also referred to as SiN fim) may be formed on the wafer W according to the exemplary sequence by alternately supplying hexachlorodisilane (Si₂Cl₆, abbreviated as HCDS) gas serving as a first process gas (source gas) and ammonia (NH₃) gas serving as a second process gas (reactive gas) onto the wafer W serving as the substrate. Herein, the components of the substrate processing apparatus 4 are controlled by the controller 210.

According to the film-forming process of the embodiment, the silicon nitride film (SiN film) is formed on the wafer W by performing a cycle a predetermined number of times (at least once). The cycle includes non-simultaneously performing: supplying HCDS gas onto the wafer W in the process chamber 38; exhausting the HCDS gas (residual gas) from the process chamber 38; supplying NH₃ gas onto the wafer W in the process chamber 38; and exhausting the NH₃ gas (residual gas) from the process chamber 38.

In the specification, the film-forming sequence according to the embodiment may be represented as follows. The same applies to other embodiments and modified examples which will be described later.

Wafer Charging and Boat Loading Step

Wafers W are charged into the boat 40 (wafer charging). Then, the boat 40 charged with wafers W is lifted by the boat elevator 46 and loaded into the process chamber 38 (boat loading). With the boat 40 loaded, the seal cap 60 seals the lower end of the reaction tube 36 through the O-ring 60A.

Pressure and Temperature Adjusting Step

The vacuum pump 56 vacuum-exhausts the process chamber 38 such that the inner pressure of the process chamber 38, that is, the pressure of the space in which the wafers W are present is set to a desired pressure (vacuum degree). At this time, the inner pressure of the process chamber 38 is measured by the pressure sensor 52, and the APC valve 54 is feedback controlled based on the measured pressure. Until at least the process for the wafers W is complete, the vacuum pump 56 continuously rotates the boat 217 and the wafer W.

The heater 34 heats the process chamber 38 such that the wafers W in the process chamber 38 are at a desired temperature. The state of electricity conducted to the heater 34 is feedback controlled based on the temperature detected by the temperature detector 58 such that the internal temperature of the process chamber 38 has a desired temperature distribution. Until at least the process for the wafers W is complete, the heater 34 continuously heats the process chamber 38.

The rotating mechanism 62 starts to rotate the boat 40 and the wafers W. Until at least the process for the wafers W is complete, the rotating mechanism 62 continuously rotates the boat 40 and the wafers W.

Film-Forming Process

When the internal temperature of the process chamber 38 is stabilized at a predetermined processing temperature, first and second steps described below are sequentially performed.

First Step

In the first step, the HCDS gas is supplied onto the wafer W in the process chamber 38.

Specifically, the valve 48a is opened to supply the HCDS gas into the gas supply pipe 44a. After the flow rate of HCDS gas is adjusted by the MFC 46a, the HCDS gas is supplied into the process chamber 38 through the nozzle 42 and exhausted through the exhaust pipe 50. Thereby, the HCDS gas is supplied onto the wafer W. Simultaneously, the valve 48b may be opened to supply N₂ gas into the gas supply pipe 44b. After the flow rate of N₂ gas is adjusted by the MFC 46b, the N₂ gas is supplied with the HCDS gas into the process chamber 38, and exhausted through the exhaust pipe 50. By supplying the HCDS gas onto the wafer W, a silicon (Si)-containing layer is formed as a first layer on the top surface of the wafer W After the first layer is formed on the wafer W, the valve 48a is closed to stop the supply of the HCDS gas into the process chamber 38. With the APC valve 54 open, the vacuum pump 56 vacuum-exhausts the interior of the process chamber 38 to remove an unreacted HCDS gas remaining in the process chamber 38 or the HCDS gas that has contributed to formation of the first layer. Simultaneously, the N₂ gas is continuously supplied into the process chamber 38 by maintaining the valve 48b open. The N₂ gas acts as a purge gas, and thus it is possible to increase an effect of exhausting the residual gas in the process chamber 38 from the process chamber 38 by the N₂ gas.

At this time, it is not necessary to completely discharge the gas remaining in the process chamber 38 and completely purge the process chamber 38. A small amount of gas remaining in the process chamber 38 does not adversely affect the subsequent second step. It is not necessary to supply the N₂ gas at a large flow rate into the process chamber 38. The purge may be performed by supplying the N₂ gas of an amount equal to the volume of the reaction tube 36 (process chamber 38) such that the second step will not be adversely affected. By not completely purging the inside of the process chamber 38, the purging time may be shortened and the throughput may be improved. The consumption of the N₂ gas is suppressed to the minimum.

Second Step

After the first step is complete, NH₃ gas is supplied onto the wafer W in the process chamber 38, i.e. onto the first layer formed on the wafer W in the process chamber 38. In the second step, the thermally activated NH₃ gas is supplied onto the wafer W.

In the second step, the valves 48a and 48b are controlled in the same manner as in the first step. After the flow rate of NH₃ gas is adjusted by the WC 46a, the NH₃ gas is supplied into the process chamber 38 through the nozzle 42 and exhausted through the exhaust pipe 50. Thereby, the NH₃ gas is supplied onto the wafer W. The NH₃ gas supplied onto the wafer W reacts with the first layer, i.e. at least a portion of the silicon-containing layer formed on the wafer W in the first step. As a result, the first layer is thermally nitrided under non-plasma atmosphere and modified into a second layer containing silicon (Si) and nitrogen (N), namely, a silicon nitride (SiN) layer. Alternately, the NH₃ gas may be plasma-excited and then supplied to the wafer W to nitride (modify) the first layer under plasma atmosphere into the second (SiN) layer.

After the second layer is formed, the valve 48a is closed to stop the supply of the NH₃ gas into the process chamber 38. An unreacted gas, the NH$_3$ gas that has contributed to formation of the second layer and reaction by-products remaining in the process chamber 38 are exhausted from the process chamber 38 in the same manner as in the first step. Similar to the first step, it is not necessary to completely discharge the gases remaining in the process chamber 38.

Performing Predetermined Number of Times

The SiN film having a desired composition and a desired thickness may be formed on the wafer W by performing a cycle including the first step and the second step of the film-forming process a predetermined number of times (n times). The first step and the second step of the cycle are performed non-simultaneously. It is preferable that the cycle is performed multiple times.

For example, the processing conditions of the film-forming process are as follows:

The processing temperature (temperature of wafer): 250° C. to 700° C.;

The process pressure (inner pressure of process chamber): 1 Pa to 4,000 Pa;

The flow rate of HCDS gas: 1 sccm to 2,000 sccm; and

The flow rate of NH$_3$ gas supply flow rate: 100 sccm to 10,000 sccm.

The film-forming process may be performed appropriately by the processing conditions above.

Purging and Returning to Atmospheric Pressure Step

After the film-forming process is complete, the valve 48b is opened and the N$_2$ gas serving as a purge gas is supplied into the process chamber 38 through the gas supply pipe 44b and then exhausted through the exhaust pipe 50. The process chamber 38 is thereby purged such that the gas or the reaction by-products remaining in the process chamber 38 are removed from the process chamber 38 (purging). Thereafter, the inner atmosphere of the process chamber 38 is replaced with the inert gas (substitution by inert gas), and the inner pressure of the process chamber 38 is returned to atmospheric pressure (returning to atmospheric pressure).

Boat Unloading and Wafer Discharging Step

Then, the seal cap 60 is lowered by the boat elevator 46 and the lower end of the reaction tube 36 is opened. The boat 40 with the processed wafers W charged therein is unloaded from the reaction tube 36 through the lower end of the reaction tube 36 (boat unloading). The processed wafers W are discharged from the boat 40 (wafer discharging).

Effects According to the Embodiment

One or more advantageous effects described below are provided according to the embodiment.

(a) Since an inert gas atmosphere may be formed in the transfer chamber, the formation of a natural oxide film on the wafer may be suppressed. Since the inner atmosphere of the transfer chamber may be circulated and purged in short time, the time required for production may be shortened and the efficiency may be improved.

(b) The oxygen concentration and the moisture concentration in the transfer chamber may be rapidly reduced and the standby time until the start of the film-forming process may be shortened, resulting in a significant improvement in productivity.

Other Embodiments

While the technique is described by way of the above-described embodiment, the above-described technique is not limited thereto. The above-described technique may be modified in various ways without departing from the gist thereof.

While HCDS gas is exemplified as the source gas according to the embodiment, the above-described technique is not limited thereto. Instead of the HCDS gas, for example, an inorganic halosilane source gas such as monochlorosilane (SiH$_3$Cl, abbreviated as MCS) gas, dichlorosilane (SiH$_2$Cl$_2$, abbreviated as DCS) gas, trichlorosilane (SiHCl$_3$, abbreviated as TCS) gas, tetrachlorosilane gas, that is, silicon tetrachloride (SiCl$_4$, abbreviated as STC) gas and octachlorotrisilane (Si$_3$Cl$_8$, abbreviated as OCTS) gas may be used as the source gas. An amino-based (amine-based) silane source gas free of halogen such as trisdimethylaminosilane (Si[N(CH$_3$)$_2$]$_3$H, abbreviated as 3DMAS) gas, tetrakisdimethylaminosilane (Si[N(CH$_3$)$_2$]$_4$, abbreviated as 4DMAS) gas, bisdiethylaminosilane (Si[N(C$_2$H$_5$)$_2$]$_2$H$_2$, abbreviated as BDEAS) gas and bis(terary-butylamino) silane gas (SiH$_2$[NH(C$_4$H$_9$)]$_2$, abbreviated as BTBAS) gas may also be used as the source gas. An inorganic silane source gas free of halogen such as monosilane (SiH$_4$, abbreviated as MS) gas, disilane (Si$_2$H$_6$, abbreviated as DS) gas and trisilane (Si$_3$H$_8$, abbreviated as TS) gas may also be used as the source gas.

While NH$_3$ gas is exemplified as the reactive gas according to the embodiment, the above-described technique is not limited thereto. Instead of the NH$_3$ gas, for example, a hydrogen nitride-based gas such as diazene (N$_2$H$_2$) gas, hydrazine (N$_2$H$_4$) gas, N$_3$H$_8$ gas and compounds thereof may be used as the reactive gas. An ethylamine-based gas such as triethylamine ((C$_2$H$_5$)$_3$N, abbreviated as TEA) gas, diethylamine ((C$_2$H$_5$)$_2$NH, abbreviated as DEA) gas and monoethylamine (C$_2$H$_5$NH$_2$, abbreviated as MEA) gas may also be used as the reactive gas. A methylamine-based gas such as trimethylamine ((CH$_3$)$_3$N, abbreviated as TMA) gas, dimethylamine ((CH$_3$)$_2$NH, abbreviated as DMA) gas and monomethylamine (CH$_3$NH$_2$, abbreviated as MMA) may also be used as the reactive gas. An organic hydrazine-based gas such as trimethylhydrazine ((CH$_3$)$_2$N$_2$(CH$_3$)H, abbreviated as TMH) may also be used as the reactive gas.

While the above-described embodiment is described based on forming a silicon nitride film (SiN film), the above-described technique is not limited thereto. For example, the above-described technique may be applied to the formations of silicon-based films such as a silicon oxide film (SiO film), a silicon oxynitride film (SiON film), a silicon oxycarbonitride film (SiOCN film), a silicon oxycarbide film (SiOC film), a silicon carbonitride film (SiCN film), a silicoboron nitride film (SiBN film) and a silicoboron carbonitride film (SiBCN film). The processing sequences and processing conditions for forming the above-described films may be substantially the same as those of the above-described embodiment, and the advantageous effects the same as those of the above-described embodiment may be provided.

While the above-described embodiment is described based on forming a silicon-based insulating film such as a silicon nitride film (SiN film), the above-described technique is not limited thereto. For example, the above-described technique may be applied to the formations of a metal-based film, that is, a film containing a metal element such as titanium (Ti), zirconium (Zr), hafnium (Hf), tantalum (Ta), niobium (Nb), aluminum (Al), molybdenum (Mo) and tungsten (W).

For example, the above-described technique may be applied to the formations of film on wafer such as TiN film, TiO film, TiON film, TiOCN film, TiOC film, TiCN film, TiBN film, TiBCN film, ZrN film, ZrO film, ZrON film, ZrOCN film, ZrOC film, ZrCN film, ZrBN film, ZrBCN film, HfN film, HfO film, HfON film, HfOCN film, HfOC film, HfCN film, HfBN film, HfBCN film, TaN film, TaO film, TaON film, TaOCN film, TaOC film, TaCN film, TaBN film, TaBCN film, NbN film, NbO film, NbON film, NbOCN film, NbOC film, NbCN film, NbBN film, NbBCN film, AlN film, AlO film, AlON film, AlOCN film, AlOC film, AlCN film, AlBN film, AlBCN film, MoN film, MoO film, MoON film, MoOCN film, MoOC film, MoCN film, MoBN film, MoBCN film, WN film, WO film, WON film, WOCN film, WOC film, WCN film, WBN film and WBCN film. Instead of forming the above-described films, the above-described technique may also be applied when the films above is doped with another element. For example, the above-described technique may also be applied when forming TiAlN film, TaAlN film, TiAlC film, TaAlC film, TiSiN and TiSiC film.

While the embodiment is described by way of an example in which the film is deposited on the wafer W, the above-described technique is not limited thereto. The above-described technique may be applied to the processes such as an oxidation process, a diffusion process, an annealing process and an etching process of the wafer W or the film formed on the wafer W.

The above-described embodiment and the modified examples may be appropriately combined. The processing sequences and processing conditions of the combinations may be substantially the same as the above-described embodiment.

According to the technique described herein, the time required to reduce the oxygen concentration in the transfer chamber is shortened.

What is claimed is:

1. A substrate processing apparatus comprising:
   a transfer chamber wherein a substrate from a container is transported;
   a transfer robot configured to transfer the substrate through the transfer chamber;
   a purge gas supply mechanism configured to supply a purge gas into the transfer chamber; and
   a pressure control mechanism installed at an exhaust channel wherethrough an inner atmosphere of the transfer chamber is exhausted to control an inner pressure of the transfer chamber and comprising:
      a lower portion directly connected to the exhaust channel;
      an exhaust damper comprising a cover member, wherein the cover member is provided over the lower portion and has a shape of a box comprising an open side and a bottom opening provided at a bottom of the cover member to face the exhaust channel at the lower portion; and
      an adjusting damper comprising a back pressure valve provided in the cover member, wherein the back pressure valve is configured to open and close the bottom opening of the cover member depending on the inner pressure of the transfer chamber,
   wherein the cover member is configured such that the bottom opening of the cover member is fluidically coupled to the open side of the cover member if the bottom opening is opened by the back pressure valve, and that the bottom opening of the cover member is fluidically decoupled from the open side of the cover member if the bottom opening is closed by the back pressure valve in a state where the cover member is pressed against the lower portion of the pressure control mechanism.

2. The substrate processing apparatus of claim 1, further comprising:
   a loading port provided at a side of the transfer chamber comprising a housing with an opening to the transfer chamber and a local exhaust port; and
   a controller configured to control at least one among: the pressure control mechanism and the purge gas supply mechanism such that the inner pressure of the transfer chamber is equal to or higher than an inner pressure of the housing of the loading port, whereby the inner pressure of the housing of the loading port is higher than an atmospheric pressure,
   wherein the pressure control mechanism and the purge gas supply mechanism are connected to the transfer chamber.

3. The substrate processing apparatus of claim 1, wherein the cover member is capable of being elevated to allow the inner atmosphere of the transfer chamber to flow around the cover member.

4. The substrate processing apparatus of claim 1, wherein the back pressure valve is further configured to be elevated to be opened when the inner pressure of the transfer chamber is higher than a predetermined pressure.

5. The substrate processing apparatus of claim 4, wherein the predetermined pressure is adjusted by adjusting a weight of the back pressure valve.

6. The substrate processing apparatus of claim 1, further comprising:
   a controller configured to control both of the pressure control mechanism and the purge gas supply mechanism such that the inner pressure of the transfer chamber is higher than an atmospheric pressure;
   a standby chamber provided adjacent to the transfer chamber and accommodating a substrate retainer charged with the substrate; and
   a gate valve provided between the transfer chamber and the standby chamber,
   wherein the controller is further configured to open the gate valve when the exhaust damper is not spaced apart from the exhaust channel and the inner pressure of the transfer chamber is maintained higher than an atmospheric pressure and lower than an inner pressure of the standby chamber.

7. The substrate processing apparatus of claim 6, wherein the controller is further configured to open the gate valve when the back pressure valve puts the pressure control mechanism into an open state.

8. The substrate processing apparatus of claim 7, wherein the controller is further configured to open the gate valve when the inner pressure of the standby chamber is higher than that of the transfer chamber.

9. The substrate processing apparatus of claim 8, wherein the controller is further configured to close the gate valve when the adjusting damper is in a closed state.

10. The substrate processing apparatus of claim 6, further comprising: a pair of ventilation mechanisms configured to exhaust the inner atmosphere of the transfer chamber, wherein the pair of ventilation mechanisms are provided at left and right sides of a lower portion of the transfer chamber with the transfer robot therebetween.

11. The substrate processing apparatus of claim 10, further comprising:

a porous plate disposed under an arm of the transfer robot and dividing the transfer chamber into an upper space and a lower space;

a pair of cleaning mechanisms provided at a ceiling of the transfer chamber; and a pair of circulation channels connecting the pair of cleaning mechanisms to the pair of ventilation mechanisms, respectively, wherein the pair of ventilation mechanisms are connected to a pair of sub-exhaust channels and the pair of circulation channels, respectively, and the pair of sub-exhaust channels are merged at a downstream side thereof, and the purge gas is supplied by the purge gas supply mechanism into the transfer chamber via the pair of cleaning mechanisms and the ceiling of the transfer chamber.

12. The substrate processing apparatus of claim 11, further comprising a detector provided at an upstream side of the pair of cleaning mechanisms and configured to detect an oxygen concentration in the transfer chamber.

13. The substrate processing apparatus of claim 12, wherein the controller is further configured to open the gate valve when an oxygen concentration in the standby chamber is lower than the oxygen concentration in the transfer chamber.

14. The substrate processing apparatus of claim 1, further comprising:

a standby chamber provided adjacent to the transfer chamber and accommodating a substrate retainer charged with the substrate, wherein the pressure control mechanism maintains a gauge pressure of the transfer chamber to be 1 to 7.5 times greater than a gauge pressure of the standby chamber when the cover member is pressed against the lower portion of the pressure control mechanism and the back pressure valve is open.

15. The substrate processing apparatus of claim 1, wherein the exhaust channel is configured to be closed when the bottom of the cover member is pressed against the lower portion of the pressure control mechanism and the back pressure valve is closed, and the cover member is configured to open the exhaust channel when the bottom of the cover member is detached from the lower portion of the pressure control mechanism.

16. A method of manufacturing a semiconductor device using the substrate processing apparatus of claim 1, comprising:

(a) controlling the inner pressure of the transfer chamber by the pressure control mechanism provided at the exhaust channel wherethrough the inner atmosphere of the transfer chamber is exhausted;

(b) transporting a substrate from the container within the transfer chamber;

(c) loading the substrate into a process chamber; and (d) processing the substrate in the process chamber.

* * * * *